PIEZOELECTRIC CERAMIC COMPOSITIONS

Filed Aug. 21, 1967

MASAMITSU NISHIDA AND
HIROMU OUCHI, Inventors
By, Wenderoth, Lind and Ponack,
Attorneys United States Patent Office 3,597,354
Patented Aug. 3, 1971

3,597,354

PIEZOELECTRIC CERAMIC COMPOSITIONS

Masamitsu Nishida, Osaka-shi, and Hiromu Ouchi, Toyonaka-shi, Japan, assignors to Matsushita Electric Industrial Co., Ltd., Kadoma, Osaka, Japan Filed Aug. 21, 1967, Ser. No. 662,036
Int. Cl. C04b 35/46, 35/48
U.S. Cl. 252—62.9 2 Claims

ABSTRACT OF THE DISCLOSURE

Piezoelectric ceramic compositions are provided which are characterized by high stability with temperature and time in resonant frequency and by high electromechanical coupling coefficients and high dielectric constants or by high electromechanical coupling coefficients and high mechanical quality factors. These ceramic compositions are ternary systems, in solid solution form, of the type formula $$Pb(Co_{1/3}Nb_{2/3})O_3—PbTiO_3—PbZrO_3$$

Optimal ternary compounds are within the area ABCDEF of FIG. 2 of the accompanying drawings; very best compounds are defined by AGHIF. An especially good material consists of the solid solution of the formula $$Pb(CO_{1/3}Nb_{2/3})_{0.125}Ti_{0.435}Zr_{0.440}O_3$$

This invention relates to piezoelectric ceramic compositions and articles of manufacture fabricated therefrom. More particularly, the invention pertains to novel ferroelectric ceramics which are polycrystalline aggregates of certain constituents. These piezoelectric compositions are sintered to ceramics by ordinary ceramic techniques and thereafter the ceramics are polarized by applying a D-C voltage between the electrodes to impart thereto electromechanical transducing properties similar to the well known piezoelectric effect. The invention also encompasses the calcined product of the raw ingredients and the articles of manufacture such as electromechanical transducers fabricated from the sintered ceramics.

The ceramic bodies embodied by the present invention exist basically as solid solution comprising the ternary system $Pb(Co_{1/3}Nb_{2/3})O_3—PbTiO_3—PbZrO_3$.

The use of piezoelectric materials in various transducer applications in the production, measurement and sensing of sound, shock, vibration, pressure, etc. has increased greatly in recent years. Both crystal and ceramic types of transducers have been widely used. But because of their potentially lower cost and facility in the fabrication of ceramics with various shapes and sizes and their greater durability for high temperature and/or for humidity than that of crystalline substances such as Rochelle salt, piezoelectric ceramics materials have recently gained importance in various transducer applications.

The piezoelectric characteristics of ceramics required in various technical applications vary with the particular kind of application. For example, electromechanical transducers such as phonograph pick-ups and microphone require piezoelectric ceramics characterized by a substantially high electromechanical coupling coefficient and dielectric constant. On the other hand, it is desired in filter applications of piezoelectric ceramics that the material exhibits a higher value of mechanical quality factor and high electromechanical coupling coefficient. Furthermore, ceramic materials require a high stability with temperature and time in resonant frequency and in other electrical properties.

As more promising ceramics for these requirements, lead titanate-lead zirconate is in wide use up to now. However, it is difficult to get a very high mechanical quality factor along with high planar coupling coefficient in the lead titanate-lead zirconate ceramics. Moreover, the dielectric and piezoelectric properties of the lead titanate-lead zirconate ceramics change greatly with firing technique due to evaporation of PbO.

It is, therefore, the fundamental object of the present invention to provide novel and improved piezoelectric ceramic materials which overcome at least one of the problems outlined above. A more specific object of the invention is to provide improved polycrystalline ceramics characterized by very high mechanical quality factor along with high piezoelectric coupling coefficient.

Another object of the invention is the provision of novel piezoelectric ceramic compositions, certain properties of which can be adjusted to suit various applications.

A further object of the invention is the provision of improved electromechanical transducers utilizing, as the active elements, electrostatically polarized bodies of the novel ceramic compositions.

These objects of the invention and the manner of their attainment will be readily apparent from a reading of the following description and from the accompanying drawing, in which.

Figure 1:
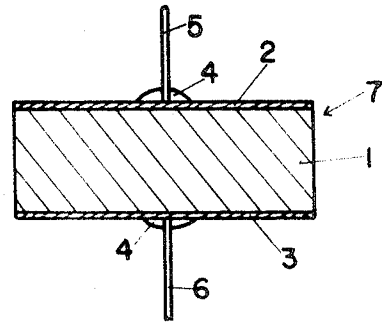
FIG. 1 is a cross-sectional view of an electromechanical transducer embodying the present invention.

Before proceeding with a detailed description of the piezoelectric materials contemplated by the invention, their illustrated application in electromechanical transducers will be described with reference to FIG. 1 of the drawings wherein reference character 7 designates, as a whole, an electromechanical transducer having, as its active element, a preferably disc-shaped body 1 of piezoelectric material according to the present invention.

Body 1 is electrostatically polarized, in a manner hereinafter set forth, and is provided with a pair of electrodes 2 and 3, applied in a suitable and per se conventional manner, on two opposed surfaces thereof. Wire leads 5 and 6 are attached conductively to the electrodes 2 and 3 respectively by means of solder 4. When the ceramic is subjected to shock, vibration or other mechanical stress, the generated electrical output can be taken from wire leads 5 and 6. Conversely, as with other piezoelectric transducers, application of electrical voltage to electrodes 5 and 6 will result in mechanical deformation of the ceramic body. It is to be understood that the term electromechanical transducer as used herein is taken in its broadest sense and includes piezoelectric filter, frequency control devices, and the like, and that the invention may also be used and adapted to various other applications requiring materials having dielectric, piezoelectric and/or electrostrictive properties.

According to the present invention, the ceramic body 1, FIG. 1, is formed of a novel piezoelectric composition which is a polycrystalline ceramic composed of $$Pb(Co_{1/3}Nb_{2/3})O_3—PbTiO_3—PbZrO_3$$

The present invention is based on the discovery that within particular ranges of this ternary system the specimens exhibit a very high mechanical quality factor along with high planar coupling coefficient.

The present invention has various advantages in manufacturing process and in application for ceramic transducers. It has been known that the evaporation of PbO during firing is a problem in sintering of lead compounds such as lead titanate zirconate. The invented composition, however, shows a smaller amount of evaporated PbO than usual lead titanate zirconate does. The ternary system can be fired without any particular control of PbO atmosphere. A well sintered body of the present composition is obtained by firing in a ceramic crucible with a ceramic cover made of $Al_2O_3$ ceramics. A high sintered density is desirable for humidity resistance and high piezoelectric response when the sintered body is applied to a resonator, etc.

Figure 2:
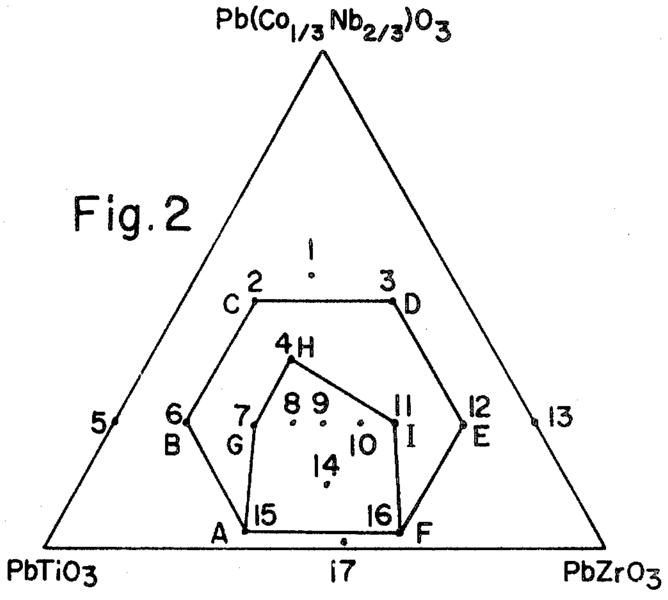
FIG. 2 is a triangular compositional diagram of materials utilized in the present invention.

All possible compositions coming within the ternary system $Pb(Co_{1/3}Nb_{2/3})O_3$—$PbTiO_3$—$PbZrO_3$ are represented by the triangular diagram constituting FIG. 2 of the drawings. Some compositions represented by the digram, however, do not exhibit high piezoelectricity, and many are electromechanically active only to a slight degree. The present invention is concerned only with those compositions exhibiting piezoelectric response of appreciable magnitude. As a matter of convenience, the planar coupling coefficient ($K_p$) of test discs will be taken as a measure of piezoelectric activity. Thus, within the area bounded by lines connecting points ABCDEF, FIG. 2, all compositions polarized and tested showed a planar coupling coefficient of approximately 15% or higher. The compositions in the area of the diagram bounded by lines connecting points A, G, H, I, and F, FIG. 2, exhibit a planar coupling coefficient of approximately 30% or higher. The molar percent of the three components of compositions ABCDEFGHI are as follows:

| | $Pb(Co_{1/3}Nb_{2/3})O_3$ | $PbTiO_3$ | $PbZrO_3$ |
|---|---|---|---|
| A | 3.0 | 62.5 | 34.5 |
| B | 25.0 | 62.5 | 12.5 |
| C | 50.0 | 37.5 | 12.5 |
| D | 50.0 | 12.5 | 37.5 |
| E | 25.0 | 12.5 | 62.5 |
| F | 3.0 | 34.5 | 62.5 |
| G | 25.0 | 50.0 | 25.0 |
| H | 37.5 | 37.5 | 25.0 |
| I | 25.0 | 25.0 | 50.0 |

Furthermore, the compositions near the morphotropic phase boundary of the ternary system, particularly $$Pb(Co_{1/3}Nb_{2/3})_{0.250}Ti_{0.375}Zr_{0.375}O_3$$

$$Pb(Co_{1/3}Nb_{2/3})_{0.125}Ti_{0.435}Zr_{0.440}O_3$$

give ceramic products having a planar coupling coefficient of 55% or higher.

According to the present invention, piezoelectric and dielectric properties of the ceramics can be adjusted to suit various applications by selecting the proper composition.

The composition described herein may be prepared in accordance with various well known ceramic procedures. A preferred method, however, hereinafter more fully described, consists in the use of PbO or $Pb_3O_4$, CoO or $Co_2O_3$, $Nb_2O_5$, $TiO_2$, $ZrO_2$.

The starting materials, viz., lead oxide (PbO), cobalt oxide (CoO), niobia ($Nb_2O_5$), titania ($TiO_2$), zirconia ($ZrO_2$), all of relatively pure grade (e.g., C.P. grade) are intimately mixed in a rubber-lined ball mill with distilled water. In milling the mixture, care should be exercised to avoid, or the proportions of ingredients varied to compensate for, contamination by wear of the milling ball or stones.

Following this wet milling, the mixture is dried and mixed to assure as homogeneous a mixture as possible. Thereafter, the mixture is suitably formed into a desired form at a pressure of 400 kg/cm.$^2$ (kilograms per square centimeter). The obtained compacts are pre-reacted by calcination at a temperature of around 850° C. for 2 hours.

After calcination, the reacted material is allowed to cool and is then wet milled to a small particle size. Once again, care should be exercised to avoid, or proportions of ingredients varied to compensate for, contamination by wear of the milling balls or stones. Depending on preference and the shapes desired, the material may be formed into a mix or slip suitable for pressing, slip casting, or extruding, as the case may be, in accordance with per se conventional ceramic procedures. The sample for which data are given hereinafter were prepared by mixing 100 grams of the milled pre-sintered mixture with 5 cc. of distilled water. The mix was then pressed into discs of 20 mm. diameter and 2 mm. thickness at a pressure of 700 kg./cm.$^2$. The pressed discs are fired at 1200–1270° C. for 45 minutes. According to the present invention, there is no need to fire the composition in an atmosphere of PbO and no special care is required for the temperature gradient in the furnace, in contrast to the prior art requirements. Thus, according to the present invention, uniform and excellent piezoelectric ceramic products can be easily obtained simply by covering the samples in an alumina crucible during firing.

The sintered ceramics are polished on both surfaces to the thickness of one millimeter. The polished disc surfaces may then be coated with silver paint and fired to form silver electrodes, these procedures being carried out in per se conventional manner. Finally, the discs are polarized while immersed in a bath of silicone oil at 100° C. A voltage gradient of D-C 4 kv. per mm. is maintained for one hour, and the discs are field-cooled to room temperature (15 to 30° C.) in thirty minutes.

The piezoelectric and dielectric properties of the polarized specimens have been measured at 20° C. in a relative humidity of 50% and at a frequency of 1 kc. Examples of specific ceramic compositions according to this invention and various pertinent electromechanical and dielectric properties thereof are given in the following table. From the table, it will be readily evident that the exemplary compositions selected from the area bounded by lines connecting points ABCDEF of the diagram of FIG. 2 are characterized by very high mechanical quality factor and high planar coupling coefficient.

The compositions, $Pb(Co_{1/3}Nb_{2/3})_{0.125}Ti_{0.435}Zr_{0.440}O_3$ and $Pb(Co_{1/3}Nb_{2/3})_{0.250}Ti_{0.430}Zr_{0.320}O_3$, show a high resonant frequency stability with temperature within the range 20° C. to 85° C. The changes in resonant frequency are 0.1% and 0.2%, respectively. These properties are important to the use of piezoelectric compositions in filter applications.

TABLE

| | Mole percent of composition | | | 24 hours after poling | | |
|---|---|---|---|---|---|---|
| Ex. No. | $Pb(Co_{1/3}Nb_{2/3})O_3$ | $PbTiO_3$ | $PbZrO_3$ | Dielectric constant, $\epsilon$, at 1 kc./s. | Planar coupling coeff., $K_p$ | Mechanical quality factor, $Q_m$ |
| 1 | 55.0 | 25.0 | 20.0 | 2,105 | 0.105 | 250 |
| 2 | 50.0 | 37.5 | 12.5 | 2,298 | 0.169 | 470 |
| 3 | 50.0 | 12.5 | 37.5 | 1,527 | 0.165 | 510 |
| 4 | 37.5 | 37.5 | 25.0 | 1,911 | 0.546 | 422 |
| 5 | 25.0 | 75.0 | | 355 | 0.076 | 252 |
| 6 | 25.0 | 62.5 | 12.5 | 403 | 0.190 | 695 |
| 7 | 25.0 | 50.0 | 25.0 | 774 | 0.323 | 601 |
| 8 | 25.0 | 43.0 | 32.0 | 1,442 | 0.475 | 513 |
| 9 | 25.0 | 37.5 | 37.5 | 1,189 | 0.576 | 465 |
| 10 | 25.0 | 31.0 | 44.0 | 451 | 0.426 | 869 |
| 11 | 25.0 | 25.0 | 50.0 | 374 | 0.319 | 1,240 |
| 12 | 25.0 | 12.5 | 62.5 | 316 | 0.206 | 2,101 |
| 13 | 25.0 | | 75.0 | 332 | 0.058 | 1,950 |
| 14 | 12.5 | 43.5 | 44.0 | 1,313 | 0.608 | 469 |
| 15 | 3.0 | 62.5 | 34.5 | 318 | 0.315 | 620 |
| 16 | 3.0 | 34.5 | 62.5 | 405 | 0.302 | 750 |
| 17 | 1.0 | 46.0 | 53.0 | 1,022 | 0.477 | 260 |

From the foregoing table, the values of mechanical quality factor, planar coupling coefficient and dielectric constant can be adjusted to suit various applications by selecting the corresponding composition.

In addition to the superior properties shown above, compositions according to the present invention yield ceramics of good physical quality, which polarize well. It will be understood from the foregoing that the ternary ceramics $Pb(Co_{1/3}Nb_{2/3})O_3$-$PbTiO_3$-$PbZrO_3$ form excellent piezoelectric ceramic bodies.

Having thus disclosed the invention, what is claimed is:

1. A piezoelectric ceramic material consisting of the solid solution having the following formula:

$$Pb(Co_{1/3}Nb_{2/3})_{0.125}Ti_{0.435}Zr_{0.440}O_3$$

2. An electromechnical transducer element comprising the piezoelectric ceramic material of claim 1.

References Cited

UNITED STATES PATENTS

| | | | |
|---|---|---|---|
| 3,268,453 | 8/1966 | Ouchi et al. | 252—62.9 |
| 3,268,783 | 8/1966 | Saburi | 106—39 |
| 3,425,944 | 2/1969 | Ouchi et al. | 252—62.9 |
| 3,554,469 | 12/1970 | Watanabe et al. | 252—62.9 |

TOBIAS E. LEVOW, Primary Examiner

J. COOPER, Assistant Examiner

U.S. Cl. X.R.

106—39R